United States Patent [19]

Bland

[11] Patent Number: 5,610,955
[45] Date of Patent: Mar. 11, 1997

[54] CIRCUIT FOR GENERATING A SPREAD SPECTRUM CLOCK

[75] Inventor: Christopher J. Bland, San Jose, Calif.

[73] Assignee: Microclock, Inc., San Jose, Calif.

[21] Appl. No.: 563,327

[22] Filed: Nov. 28, 1995

[51] Int. Cl.⁶ ............................................. H03D 3/24
[52] U.S. Cl. ........................... 375/376; 331/18; 331/25; 327/156; 327/157
[58] Field of Search ......................... 375/371, 373, 375/375, 376, 150, 155; 327/156, 157, 158–159, 146, 147; 331/1 R, 1 A, 11, 18, 12, 14, 25

[56] References Cited

U.S. PATENT DOCUMENTS

| | | | |
|---|---|---|---|
| 3,815,042 | 6/1974 | Maunsell et al. | 331/11 |
| 4,574,243 | 3/1986 | Levine | 375/376 |
| 5,113,152 | 5/1992 | Norimatsu | 331/11 |
| 5,162,746 | 11/1992 | Ghoshal | 375/376 |

OTHER PUBLICATIONS

Hardin et al., "Spread Spectrum Clock Generation for the Reduction of Radiated Emissions", *IEEE*, 7803–1398–4/94, pp. 227–231.

International Microcircuits Inc., "CMOS LSI, Reduced EMI Clock Generator", May 2, 1994, pp. 1–8.

International Microcircuits Inc., "CMOS LSI, Spread Spectrum Clock Generator", Apr. 20, 1994, pp. 1–3.

International Microcircuits Inc., "CMOS LSI Spectrum Spread Clock Generator", Apr. 21, 1995, pp. 1–7.

*Primary Examiner*—Stephen Chin
*Assistant Examiner*—Thuy L. Nguyen
*Attorney, Agent, or Firm*—Townsend and Townsend and Crew

[57] ABSTRACT

A phase-locked loop (PLL) circuit which receives a signal at a reference frequency to generate a spread spectrum clock signal. A first divider circuit in the PLL and connected to the PLL input terminal generates an output signal at the reference frequency divided by a first variable integer M. A second divider circuit connected to the PLL output terminal generating an output signal at the output frequency divided by a second variable integer N. The PLL also has a circuit which periodically varies the first variable integer M and the second variable integer N. This permits the frequency of the output signal to vary precisely between two predetermined frequencies to spread the spectrum of output frequencies.

10 Claims, 2 Drawing Sheets

5,610,955

CIRCUIT FOR GENERATING A SPREAD SPECTRUM CLOCK

BACKGROUND OF THE INVENTION

The present invention relates to clock circuits and more particularly, to phase-locked loop circuits with varying frequencies.

All electronic equipment inherently generates electromagnetic interference (EMI) of one sort or another. This EMI can affect the operation of other equipment. A common example of this would be placing a toaster next to a TV set. When the toaster is running, strange lines, the EMI, appear in the TV picture. In the United States all electronic equipment must meet rules for electromagnetic emissions laid down by the Federal Communications Commission (FCC). These rules are designed to ensure that EMI does not affect other electronic equipment. The FCC rules specify how much energy a piece of electronic equipment may radiate at any particular frequency.

Any electronic equipment that incorporates digital circuits usually requires a clock signal of some frequency. In sophisticated equipment, such as computers, this clock signal can be of quite high frequency, such as 60 MHz. In addition, this clock often is connected to several components so that the wire or trace on a circuit board can be quite long. A long wire acts as an antenna with the result that the electronic equipment radiate a lot of energy at the clock frequency and its harmonics. This can be troublesome when trying to meet FCC rules.

FIG. 1 shows a spectral plot of energy versus frequency for an ideal clock. All the energy is concentrated at the clock frequency (and its harmonics), The plot also shows the FCC level. This clock exceeds that level. A well known technique to reduce the peak energy is to spread the spectrum of the clock. This technique is used, for example, in spread spectrum radio equipment. By spreading the clock energy over a broader frequency band, then no peak will exceed the FCC level. This is shown in FIG. 2.

Phase-locked loop (PLL) circuits have been used to provide precise clock signals in a variety of applications in the electronics field. The present invention is an improvement over a conventional PLL. According to the present invention, the frequencies of the output signal from the PLL can be precisely controlled. Furthermore, the rate at which the frequency changes can also be controlled.

SUMMARY OF THE INVENTION

The present invention provides for a phase-locked loop (PLL) circuit which has an input terminal receiving a first signal at a reference frequency and an output terminal transmitting a second signal at an output frequency. A first divider circuit is connected to the input terminal to generate an output signal at the reference frequency divided by a first variable integer M. A second divider circuit is connected to the output terminal for generating an output signal at the output frequency divided by second variable integer N. The PLL also has a reference voltage circuit and a voltage-controlled oscillator which has an output node connected to the output terminal and an input node connected to the reference voltage circuit. A phase detector having first and second input nodes has the first input node connected to an output node of the first divider circuit and the second input node connected to an output node of the second divider circuit so that the phase detector generates an output signal indicative of a difference between the first and second divider output signals. A charge pump is connected to the phase detector and to the reference voltage circuit. The charge pump is responsive to the phase detector output signal to vary the reference voltage of the reference voltage circuit so that voltage from the voltage-controlled oscillator varies. The PLL also has a circuit which periodically varies the first variable integer M and the second variable integer N. This permits the frequency of the output signal to vary precisely between two predetermined frequencies to spread the spectrum of output frequencies.

DETAILED DESCRIPTION OF PREFERRED EMBODIMENTS

Figure 1:
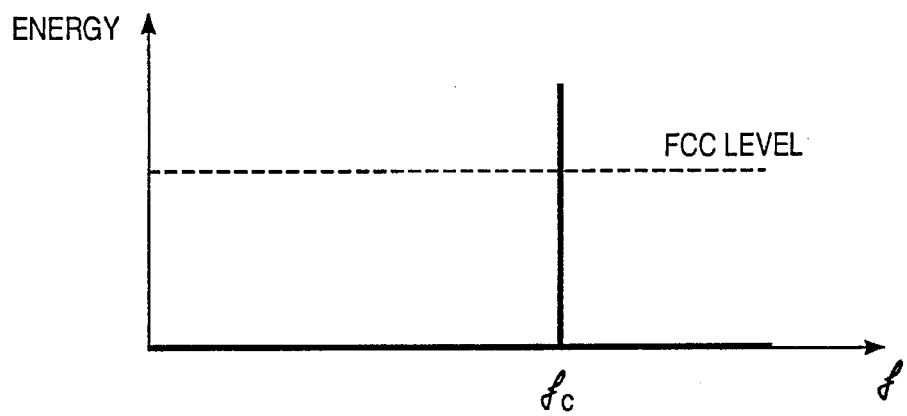
FIG. 1 is a graph of energy versus frequency for an ideal clock circuit.
Figure 2:
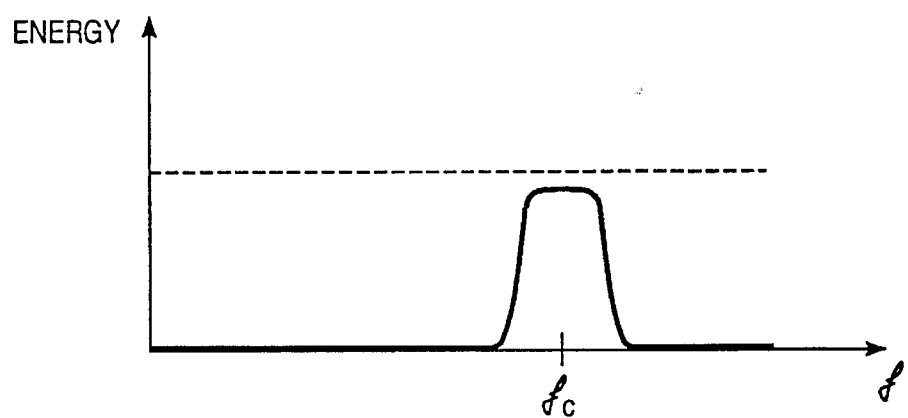
FIG. 2 is a graph of energy versus frequency for a clock circuit having a spread spectrum.
Figure 3:
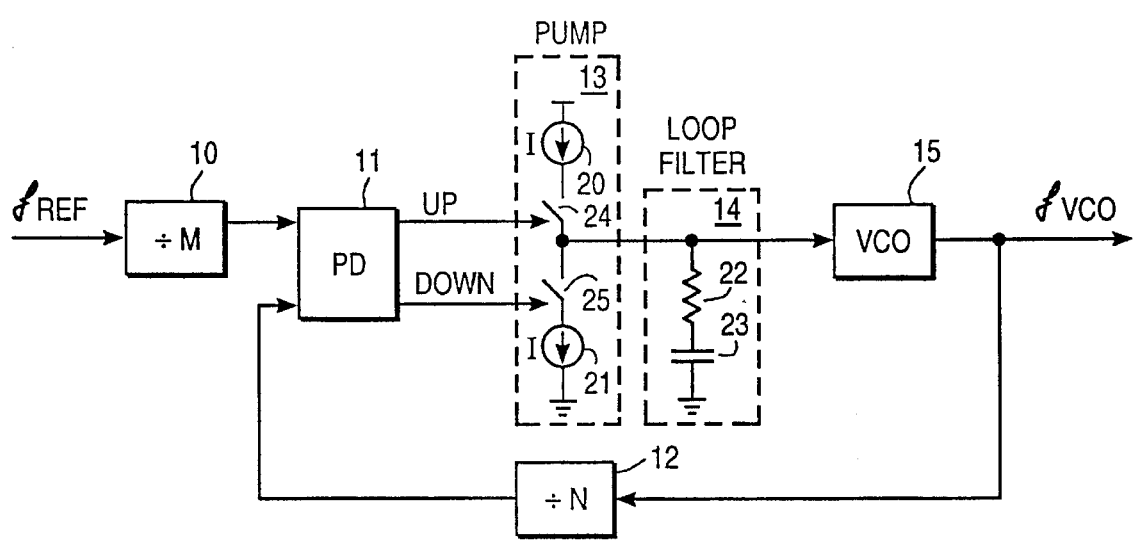
FIG. 3 is a block diagram of a phase-locked loop in accordance with the prior art.

FIG. 3 shows a block diagram of a standard phase-locked loop (PLL) for frequency synthesis. The PLL receives a signal at a reference frequency $f_{REF}$ connected to an input terminal of a divider circuit 10, which divides, or slows, the incoming signal by predetermined amount M. The output of divider circuit 10 is connected to one of two inputs of a phase detector circuit 11, which has its output connected to a charge pump circuit 13, which is represented by switches responsive to the phase detector circuit and reference current circuits 20 and 21. The charge pump circuit 13 is also connected to a loop filter circuit, a series-connected capacitor 23 and resistor 22. Also connected to the same node is an input terminal of a voltage-controlled oscillator (VCO) 15 which has an output terminal forming the output terminal of the PLL. The output terminal of the VCO 15 is also connected to a second divider circuit 12, which divides the frequency of the output signal by a predetermined amount N. A feedback relationship is established by the connection of the output of the divider circuit 12 to the second input of the phase detector circuit 11.

The operation of the PLL is as follows. The clock frequencies of the two input signals to the phase detector 11 are $f_{REF}/M$ and $f_{VCO}/N$ and the feedback arrangement of the PLL circuit keeps the two frequencies the same. The phase detector 11 compares the phase and frequency of the rising edges of the two input signals and generates one of three states. If the phase and frequency of the two input signals are the same, the loop is locked. Neither UP nor DOWN signal is asserted and the two switches 24 and 25 in the charge pump 13 remain open. The voltage stored on the loop filter capacitor 23 is unchanged and the voltage-controlled oscillator (VCO) 15 continues to run at the same frequency.

If the reference input to the phase detector circuit 11 is running faster than the VCO input, the output signal of the VCO 15 is running too slow. In this case, the phase detector 11 generates an UP signal which turns on the upper switch 24 in the charge pump circuit 13 and so charges the loop filter capacitor 23. This raises the frequency of the VCO 15 signal until the two input signals to the phase detector circuit 11 are the same.

Conversely, if the reference input signal to the phase detector circuit 11 is running slower than the VCO output signal, the VCO 15 is running too fast. In this case, the phase detector circuit 11 generates a DOWN signal that turns on the lower switch 25 in the charge pump circuit 13 and so discharges the loop filter capacitor 23. This lowers the speed of the VCO 15 until the two input signals to the phase detector circuit 11 are the same.

As described above, a property of phase-locked loops is that the feedback loop (the phase detector 11, charge pump 13, loop filter 14, VCO 15 and the divider circuit 12) makes the two input signals to the phase detector 11 run at the same frequency. In quantitative terms, since one input signal has frequency $f_{REF}$ divided by M, and the other input is $f_{VCO}$ divided by N, then:

$$\frac{f_{REF}}{M} = \frac{f_{VCO}}{N}$$

or $$f_{VCO} = \frac{N}{M} f_{REF}$$

This is the basic equation for frequency synthesis and allows the generation of frequencies which are fractions of a reference frequency (the fraction can be greater than one).

Figure 4:
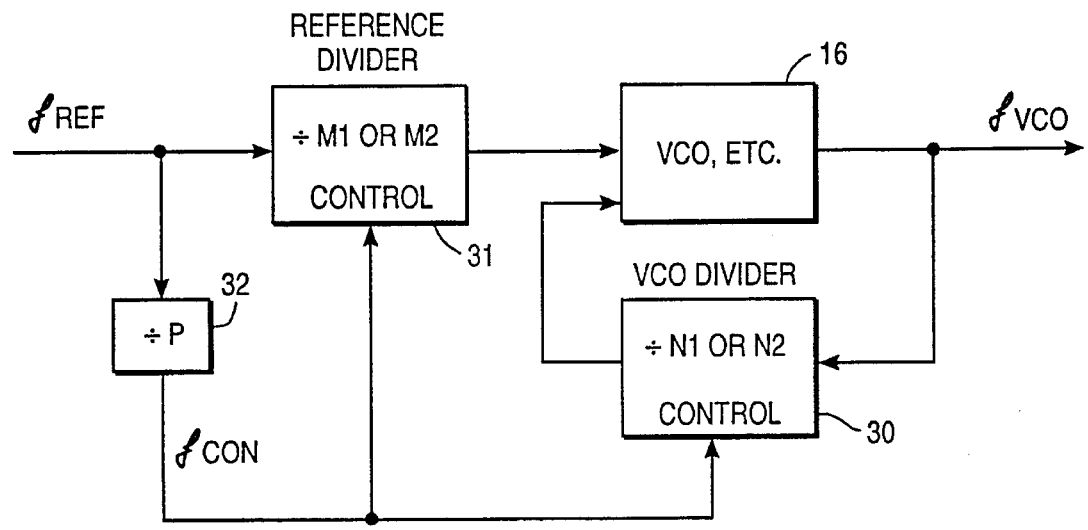
FIG. 4 is a block diagram of a phase-locked loop according to the present invention.

In accordance with the present invention, the frequency spectrum of a clock signal is spread using a PLL clock synthesizer. FIG. 4 illustrates a block diagram of the present invention. A phase detector circuit, charge pump circuit, loop filter circuit, and VCO are arranged as described with respect to FIG. 3 and denoted by a block 16. The present invention also has a divider circuit 32 which divides the reference frequency by P, a divider circuit 31 which also divides the reference frequency and corresponds to the divider circuit 10 of FIG. 3, a VCO frequency divider circuit which corresponds to the divider circuit 12 of FIG. 3. The divider circuit 31 has a control terminal and divides the reference frequency by two different divisors, M1 and M2, in response to the signal on the control terminal. Likewise, the divider circuit 30 has a control terminal and divides the reference frequency by two different divisors, N1 and N2, in response to the signal on the control terminal. Both control terminals are connected to the output terminal of the P-divider circuit 32.

Thus the output of the PLL switches between two different frequencies (N1/M1 and N2/M2) as predicted by the following equation:

$$f_{VCO} = \frac{N}{M} f_{REF}$$

Consider the case where the VCO is in a steady state running at a frequency of:

$$f_{VCO} = \frac{N1}{M1} f_{REF}$$

Then the divisors are changed to N2 and M2. This causes the phase detector to start generating an UP or DOWN to change the VCO frequency to the new value:

$$f_{VCO} = \frac{N2}{M2} f_{REF}$$

The VCO in the block 16 gradually changes frequency (at a rate determined by the charge pump current and loop filter capacitor) until it reaches this new frequency. Then, the dividers are changed again back to N1 and M1 which causes the frequency to return to the first value. The rate at which it will change is the control frequency at the output of the symmetrical P-divider which is $$f_{CON} = \frac{f_{REF}}{P}$$

Figure 5:
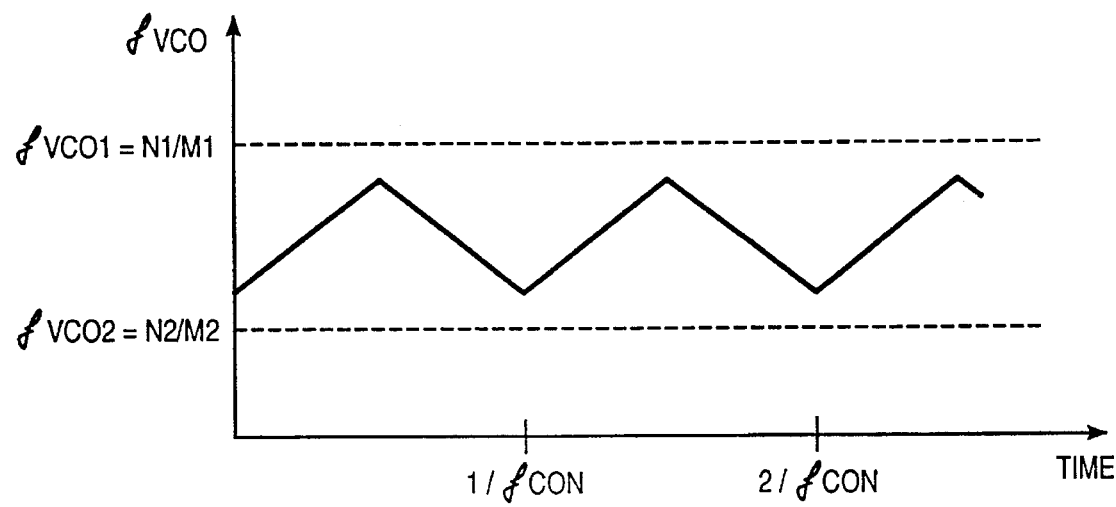
FIG. 5 is a graph of frequency versus time to illustrate how the output frequency of the phase-locked loop of FIG. 4 varies over time.

If the control frequency and the PLL parameters (charge pump current and loop filter capacitor) are selected appropriately, then the output frequency of the VCO signal never reaches either of the two programmed frequencies but continuously changes frequencies between the two extremes. FIG. 5 shows a plot of frequency versus time under these conditions. The output of the VCO slews between two different frequencies and approaches the final frequencies but never actually reaches them. This gives the spectral plot of FIG. 5.

Typical values are as follows:

$f_{REF}$=14.31818 MHz

P=7160 which gives a control frequency of 2 kHz $f_{VCO1}$=50 MHz $f_{VCO2}$=49 MHz As noted above, by selecting appropriate values for the loop filter capacitor (and resistor) and charge pump current, it is also possible to control the rate of change of the VCO frequency.

While various preferred and alternate embodiments of the present invention have been disclosed and described in detail, it should be evident that the present invention is equally applicable by making appropriate modifications to the embodiment described above. Therefore, the above description should not be taken as limiting the scope of invention which is defined by the metes and bounds of the appended claims.

What is claimed is:

1. A phase-locked loop circuit having an input terminal receiving a first signal at a reference frequency and an output terminal transmitting a second signal at an output frequency, said circuit comprising a first divider connected to said input terminal for generating an output signal at said reference frequency divided by a first variable integer M;

a second divider connected to said output terminal for generating an output signal at said output frequency divided by second variable integer N;

a circuit for supplying a reference voltage;

a voltage-controlled oscillator having an output node connected to said output terminal and an input node connected to said reference voltage circuit;

a phase detector having first and second input nodes, said first input node connected to an output node of said first divider, said second input node connected to an output node of said second divider, said phase detector generating an output signal indicative of a difference between said first and second divider output signals;

a charge pump connected to said phase detector and to a loop filter, said charge pump responsive to said phase detector output signal for varying said reference voltage of said reference voltage circuit so that voltage from said voltage-controlled oscillator varies; and means for periodically varying said first variable integer M and said second variable integer N;

whereby said output frequency varies between two predetermined frequencies.

2. The phase-locked loop circuit of claim 1 wherein said periodically varying means varies said first variable integer varies between M1 and M2, and said second variable integer between N1 and N2.

3. The phase-locked loop circuit of claim 2 and wherein said first divider comprises a first controllable divider having a first control node, said first controllable divider generating an output signal at an output frequency in response to a signal at said first control node; and wherein said second divider comprises a second controllable divider having a second control node, said second controllable divider generating an output signal at an output frequency in response to a signal at said second control node.

4. The phase-locked loop circuit of claim 3 wherein said periodically varying means comprises a third divider connected to said input terminal for generating an output signal at said reference frequency divided by an integer P; said first variable integer varies between M1 and M2, and said second variable integer varies between N1 and N2.

5. The phase-locked loop circuit of claim 1 wherein said charge pump and reference voltage circuit changes said reference voltage at a predetermined rate of change.

6. The phase-locked loop circuit of claim 5 wherein said reference voltage circuit comprises a resistance means and a capacitor connected in series.

7. The phase-locked loop circuit of claim 6 wherein said charge pump charges and discharges said capacitor at preselected rates, and said resistance means and said capacitor having preselected values so that said output frequency varies between said two predetermined frequencies at a predetermined rate.

8. The phase-locked loop circuit of claim 1 wherein said two predetermined frequencies comprise 49 MHz and 50 MHz.

9. The phase-locked loop circuit of claim 8 wherein said reference frequency comprises 14.31818 MHz.

10. The phase-locked loop circuit of claim 9 wherein output frequency varies between said two predetermined frequencies at a frequency comprising 2 KHz.

\* \* \* \* \*